(12) United States Patent
Mondello et al.

(10) Patent No.: US 11,715,539 B2
(45) Date of Patent: Aug. 1, 2023

(54) SAFETY AND CORRECTNESS DATA READING AND PROGRAMMING IN A NON-VOLATILE MEMORY DEVICE

(71) Applicant: Micron Technology, Inc., Boise, ID (US)

(72) Inventors: Antonino Mondello, Messina (IT); Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/943,128

(22) Filed: Sep. 12, 2022

(65) Prior Publication Data
US 2023/0005555 A1 Jan. 5, 2023

Related U.S. Application Data

(63) Continuation of application No. 16/624,728, filed as application No. PCT/IB2019/000474 on May 31, 2019, now Pat. No. 11,443,818.

(51) Int. Cl.
*G11C 16/16* (2006.01)
*G11C 16/34* (2006.01)
(Continued)

(52) U.S. Cl.
CPC ........ *G11C 16/3495* (2013.01); *G11C 16/102* (2013.01); *G11C 16/16* (2013.01);
(Continued)

(58) Field of Classification Search
CPC ... G11C 16/3495; G11C 16/102; G11C 16/16; G11C 16/3472; G11C 29/24; G11C 29/42; G11C 7/04; G11C 16/30; G11C 16/3418; G11C 29/52; G11C 2029/4402; G11C 29/021; G11C 29/028
See application file for complete search history.

(56) References Cited

U.S. PATENT DOCUMENTS

| 7,630,263 B2 | 12/2009 | Pio |
| 2006/0164898 A1 | 7/2006 | Pio |

(Continued)

FOREIGN PATENT DOCUMENTS

EP 2024839 2/2009

OTHER PUBLICATIONS

International Search Report and Written Opinion from related PCT Application No. PCT/IB2019/000474, dated Feb. 6, 2020, 11 pages.

*Primary Examiner* — Xiaochun L Chen
(74) *Attorney, Agent, or Firm* — Brooks, Cameron & Huebsch, PLLC

(57) ABSTRACT

The present disclosure relates to a method for improving the safety of the reading phase of a non-volatile memory device including at least an array of memory cells and with associated decoding and sensing circuitry and a memory controller, the method comprising:
storing in a dummy row of said memory block at least a known pattern;
performing some reading cycles changing the read trimming parameters up to the moment wherein said known value is read correctly;
adopting the trimming parameters of the correct reading for the subsequent reading phases.
The disclosure further relates to a memory device structured for implementing the above method.

20 Claims, 7 Drawing Sheets

(51) Int. Cl.
*G11C 16/10* (2006.01)
*G11C 16/26* (2006.01)
*G11C 29/24* (2006.01)
*G11C 29/42* (2006.01)

(52) U.S. Cl.
CPC .......... *G11C 16/26* (2013.01); *G11C 16/3472* (2013.01); *G11C 29/24* (2013.01); *G11C 29/42* (2013.01)

(56) References Cited

U.S. PATENT DOCUMENTS

| | | |
|---|---|---|
| 2007/0263444 A1 | 11/2007 | Gorobets |
| 2009/0106482 A1 | 4/2009 | Sarin et al. |
| 2011/0145483 A1 | 6/2011 | Sudo |
| 2016/0342494 A1 | 11/2016 | Yang et al. |
| 2018/0293029 A1 | 10/2018 | Achtenberg et al. |
| 2020/0226065 A1 | 7/2020 | Yang |
| 2020/0278896 A1* | 9/2020 | Kumari ............... G06F 11/1048 |

* cited by examiner

SAFETY AND CORRECTNESS DATA READING AND PROGRAMMING IN A NON-VOLATILE MEMORY DEVICE

PRIORITY INFORMATION

This application is a Continuation of U.S. application Ser. No. 16/624,728, filed on Dec. 19, 2019, which will issue as U.S. Pat. No. 11,443,818 on Sep. 13, 2022, which is a National Stage Application under 35 U.S.C. § 371 of International Application Number PCT/M2019/000474, filed on May 31, 2019, the contents of which are incorporated herein by reference.

TECHNICAL FIELD

The present disclosure generally relates to memory devices, and more particularly relates to embodiments relating to safety and improved performances of data reading and programming in non-volatile memory device.

Embodiments of the present disclosure relates more specifically to a method to retrim the setting of a memory component to improve the cross temp robustness of the memory device.

BACKGROUND

Memory devices are well known in the electronic field to store and allow accessing to digital information. In general, different kind of semiconductor memory devices may be incorporated into more complex systems including either non-volatile memory components as well as volatile memory components, for instance in so-called System-on-Chips (SoC) wherein the above-mentioned memory components are embedded.

Nowadays, however, the need of Real Time Operative Systems, in particular for automotive applications requires SoC with more and more increased performances and efficiency and the known solutions partially satisfy these requirements but not at cost and yield effective.

Non-volatile memory can provide persistent data by retaining stored data when not powered and can include NAND flash memory, NOR flash memory, 3DXP memories, MRAMs, STTRAM and CBRAMs, among others. NAND flash has reduced erase and write times, and requires less chip area per cell, thus allowing greater storage density and lower cost per bit than NOR flash. However, the I/O interface of NAND flash does not provide a random-access external address bus. Rather, data must be read on a block-wise basis, with typical block sizes of hundreds to thousands of bits.

Flash memory devices suffer temperature variation, in particular the increase of the temperature during their functioning. The reason is mainly due to the fact that when the floating gates forming the memory is biased in presence of a higher temperature may reach an energy level sufficient to allow a jump into the channel and the consequence is a charge lost. In other technologies using for instance charge traps, the high temperature accelerates the recombination and this means losing the stored info. These problems affect the safety and correctness of the data read from the memory device.

An aim of the present disclosure is that of providing a Flash memory device and a reading method for Flash memory devices reducing the impact of age and temperature on the performances of the memory device thus reducing the risk to lose information.

DETAILED DESCRIPTION

Figure 1:
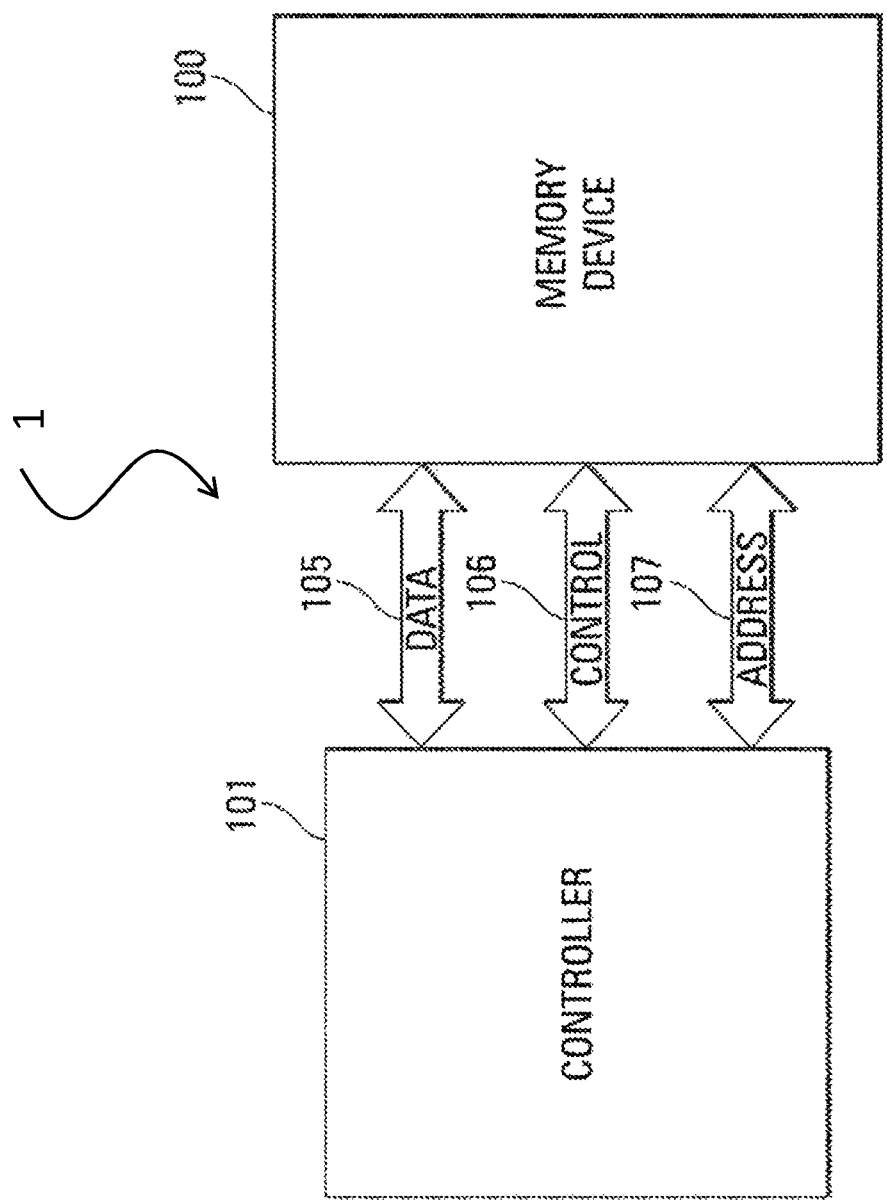
FIG. 1 shows a schematic view of a system including a memory component associated to a controller exchanging data, address and control signals with the memory device.

In the following detailed description, reference is made to the accompanying drawings that form a part hereof and in which is shown, by way of illustration, specific embodiments. In the drawings, like numerals describe substantially similar components throughout the several views. Other embodiments may be disclosed and structural, logical, and electrical changes may be made without departing from the scope of the present disclosure. The following detailed description is, therefore, not to be taken in a limiting sense.

Several embodiments of the present disclosure are directed to memory devices, systems including memory devices and methods of operating memory devices avoiding the potential problems of aging, temperature and process drift during memory operation.

In one embodiment of the present disclosure a new memory architecture is provided for an improved safety and performances of the data reading phase in the non-volatile memory device.

More specifically, the present disclosure relates to a non-volatile memory device including at least an array of memory cells with a plurality of memory blocks;
  at least a dummy row for each block for storing at least a known pattern;
  a controller of the memory device;
  sensing circuitry driven by the controller for reading the known pattern stored in the dummy row by performing some reading cycles and changing the read trimming parameters up to the moment wherein the value of said known pattern is read correctly.

The known pattern is known to the memory controller.

Moreover, the changed trimming parameter of the correct reading correspond to a set temperature value recorded in a programmable register at factory level.

In said dummy row are also stored internal block variables of the reading and/or erasing phase. Those said internal block variables are parameters such as the reading pulses and/or the target voltages applied to the memory block during the reading phase.

For a better understanding of the present disclosure, it should be noted that Flash memories typically use a basic storage element. For instance, a transistor as storage element is used in all technologies employing a floating gate, a charge trap, a split gate and the like. Other technologies like the 3D XPoint memory or Phase Change Memory adopt another kind of basic storage element. However, in all cases there is a need to maintain in time the stored data and to read such a data in the faster manner.

When a memory array is addressed, there may be one or more layers of address translation, for instance a translation between a logical address used by a host device and a physical address corresponding to a location in the memory array. Such a mechanism is very useful to implements advanced features like block wear leveling and or factory/on field block redundancy.

Although uncommon, it may happen that a power loss occurs during an erase operation. In such scenario it is very important to have a mechanism that allows the detection of blocks not well erased or incompletely erased. An erase interruption is source of some problems:
1) data can't be programmed because the memory block can show programmed bits;
2) the block can appear as erased but it has reliability, i.e. data retention issues;
3) the block can appear defective in certain locations due to depleted cells.

Since a not well erased block cannot be programmed, it would be extremely important to avoid any unexplained fail during a programming phase on a block wherein a power loss occurred.

In some embodiments at each power-up and/or reset phase and/or on user demand all the blocks in the array are verified to determine if some of them are in a power loss condition. This can be done by verifying the presence of the known pattern in the above-mentioned dummy row.

In case of a power loss:
a warning message may reach the host device if a read operation of the status register is performed; and/or
an erase on such a block is done to recovery the whole block.
This could happen automatically during the power on and/or when the problem is detected on host command. However, these measures do not prevent the problem.

Moreover, it may happen that temperature variations inside a same device may generate reading drifts called ghost temperature issue.

The drawback connected to such temperature variations has an impact on the real bit distribution that is detected by the sense amplifiers as moved with respect to the ideal central value for which they have been programmed.

Just to give a practical example, if the programming phase has been performed at −40° C., it may happen that at 120° C. the reading results include many errors. This is a real issue for all chips incorporated into automotive devices wherein a raising of the temperature during the operation of a vehicle must be taken in consideration; moreover, a raise in temperature moves or enlarges either the distribution of the well erased/programmed cells to the left and/or to the right.

Therefore, the reading phase of the memory device is most of the times performed in environments conditions similar to the original programming phase; this is true also for the erasing phase.

A memory device may be defined a sort of "real time" device in the sense that if must release reliable data in all environment operation condition, no matter if it has been tested in the factory reporting an approval because of positive results of the test.

Moreover, the drift due to temperature is further increased by the age of the device and this problem could be particularly delicate for memory devices incorporated into System-on-Chip driving autonomous vehicles.

FIG. 1 illustrates a schematic example of a system 10 incorporating a flash memory device 100. The system also includes a memory controller 101 that is coupled to the memory device 100.

The controller 101 is shown coupled to the memory device 100 over a data bus 105, a control bus 106, and an address bus 107. In one embodiment, the data bus could be a 64 bit and/or 128 bit wide double data rate (DDR) bus.

The system device 10 shown in FIG. 1 can be a host device or a System-on-Chip coupled to the memory component 100, as will appear from the description of other embodiments of the present disclosure made with reference to other figures. In any case, a portion of the System-on-Chip 10 and the memory device 100 are realized on a respective die obtained by a different lithography process. In the following description by SoC it may be intended a portion of the whole system (e.g., the portion to which the memory device is coupled) or the system as a whole, e.g., the combination of the host device portion and the memory device.

The memory component 100 is an independent structure but it is strictly associated to the host device or to the SoC structure. More particularly, the memory device 100 is associated and linked to the SoC structure partially overlapping such a structure while the corresponding semiconductor area of the SoC structure has been used for other logic circuits and for providing support for the partially overlapping structurally independent memory device 100 for instance through a plurality of pillars or other similar alternative connections such as bumping balls or with a technology similar to Flip-Chip.

More specifically, with reference to FIG. 2, the non-volatile memory component 100 includes an array 90 of Flash memory cells and a circuitry located around the memory array, as described in more detail below. The coupling between the SoC structure 10 and the memory component 100 is obtained by interconnecting a plurality of respective pads or pin terminals that are faced one toward the other in a circuit layout that keeps the alignment of the pads even if the size of the memory component is modified.

In one embodiment of the present disclosure, the arrangement of the pads of the memory component has been realized on a surface of the memory component 100, in practice on the top of the array. More specifically, the pads are arranged over the array so that, when the memory component 100 is reversed, its pads are faced to corresponding pads of the host or SoC structure 10.

At the end, the memory component 100 is manufactured according to the user's needs in a range of values that may vary according to the available technology, for instance from at least 128 Mbit to 512 Mbit or even more without any limitation for the applicant's rights. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

The final configuration will be a face-to-face interconnection SoC/Flash Array with the sense amplifiers connected to the SoC in a Direct Memory Access configuration for user modes with high frequency accesses.

The Direct Memory Access allows reducing the final latency that the SoC can experience when reading the data. Moreover, the final latency is also reduced by the block form factor, the sense amplifiers distribution between blocks, the selection of the comparison threshold in the sense amplifiers and the optimized path.

For a better understanding of the principle of the present disclosure it should be noted that a direct memory access is a feature of computer systems that allows certain hardware subsystems to access main system memory (generally volatile such as random-access memory), independent of the CPU (Central Processing Unit).

More Specifically, DMA is used when the CPU is using memory and it is typically occupied for some clock cycle of the read or write operation. Thus, whenever the I/O devices access the memory it takes a lot of time to get the data in and/or out of the memory.

The I/O devices first initiates the transfer using DMA Controller, relinquishing the control of buses from the CPU, and then CPU does other operations while the transfer is in progress, and it finally receives an interrupt from the DMA controller when the operation is done, hence address or data buses can now be used by it for its internal operations. This feature is useful at any time that the CPU cannot keep up with the rate of data transfer, or when the CPU needs to perform work while waiting for a relatively slow I/O (Input or Output) data transfer. Many hardware systems use DMA, including disk drive controllers, graphics cards, network cards and sound cards.

DMA is used according to the present disclosure for intra-chip data transfer in multi-core processors. The cores that have DMA channels can transfer data to and from the memory components with much less CPU overhead than cores without DMA channels. Similarly, a processing element inside a multi-core processor can transfer data to and from its local memory without occupying its processor time, allowing computation and data transfer to proceed in parallel.

The direct memory access of the present disclosure employs boundary scan cells and sense amplifiers as a system and method for addressing direct memory access operation and locating the memory address to a specific DMA flash array. In this respect, a modified JTAG cell structure is implemented to allow enlarging the memory pages to be read in a direct access.

Figure 2:
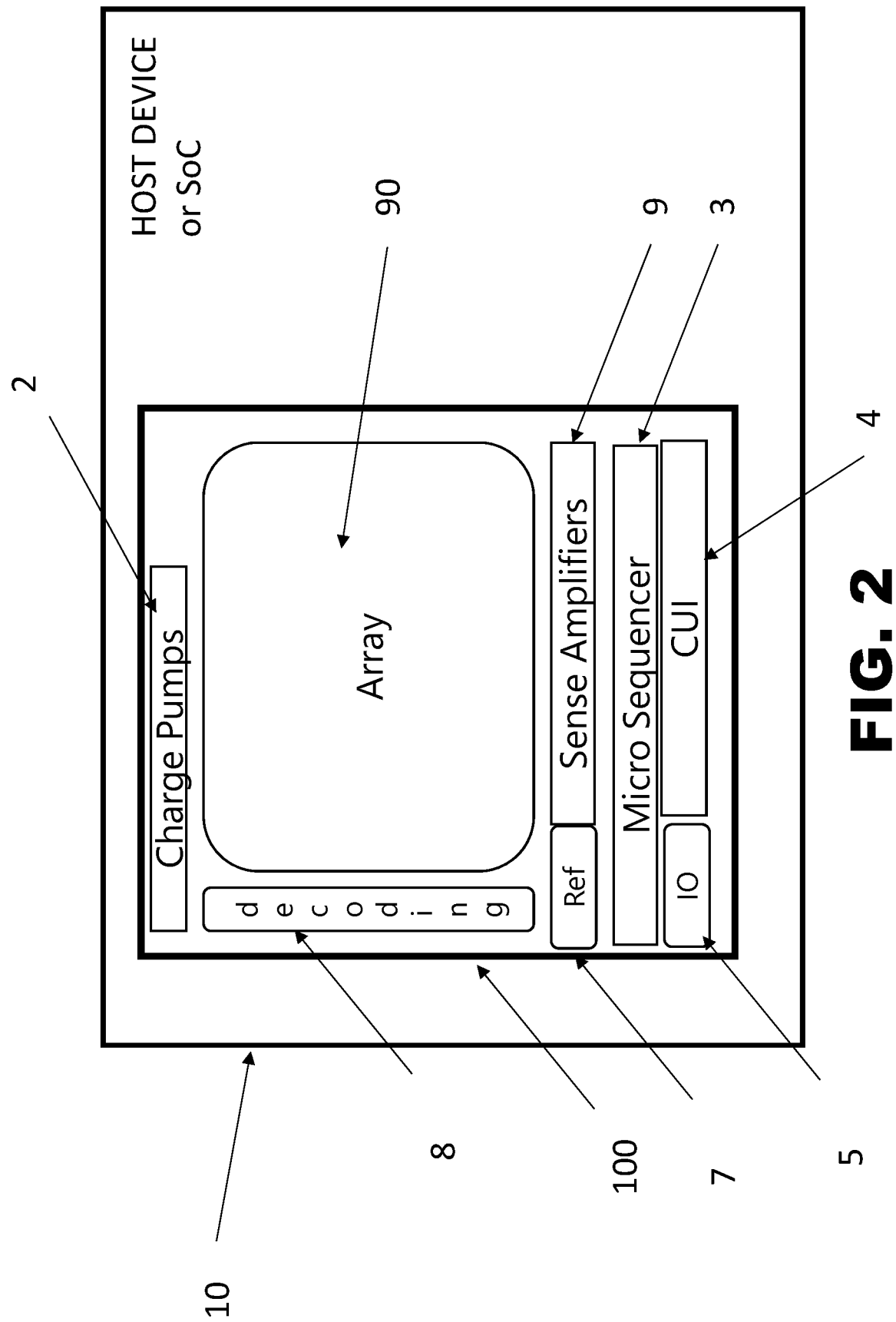
FIG. 2 is a schematic view of the memory component according to the present disclosure.

With more specific reference to the example of FIG. 2, the main structure of the memory component 100 according to an embodiment of the present disclosure will be disclosed.

The memory component 100 includes at least: an I/O circuit 5, a micro-sequencer 3, an array of memory cells 90, voltage and current reference generators 7, charge pumps 2 and decoding circuitry 8 located at the array periphery or below the array, sense amplifiers 9 and corresponding latches, a command user interface, for instance a CUI block 4.

The array of memory cells 90 includes non-volatile Flash memory cells. The cells can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages and timing on the access and data lines.

To write and erase the memory cells of the Array 90 it is provided a dedicated logic circuit portion including a simplified Reduced Instruction Set Computer (RISC) controller or a Modify Finite State Machine or that is the logic circuit for handling the programming and erasing algorithms.

To read the memory cells of the array 90 it is provided a dedicated circuit portion including an optimized Read Finite State Machine or RISC that is used to ensure high read performance, such as: branch prediction, fetch/pre-fetch, interrupt management, and so on. The error correction is left, as operation, to the SoC 10; the additional bits are provided to the controller 101 to store any possible ECC syndrome associated with the page. The ECC cells allows the host controller to understand if corruption is happening in the data plus address content. The ECC allows the host also to correct the received data. the host is responsible to fix the data in the memory based on the correction made in the received data.

The writing and erasing phases above reported are handled by the memory controller located inside the memory device, since the internal flash controller does not work in read operations that are driven by the host.

Figure 3:
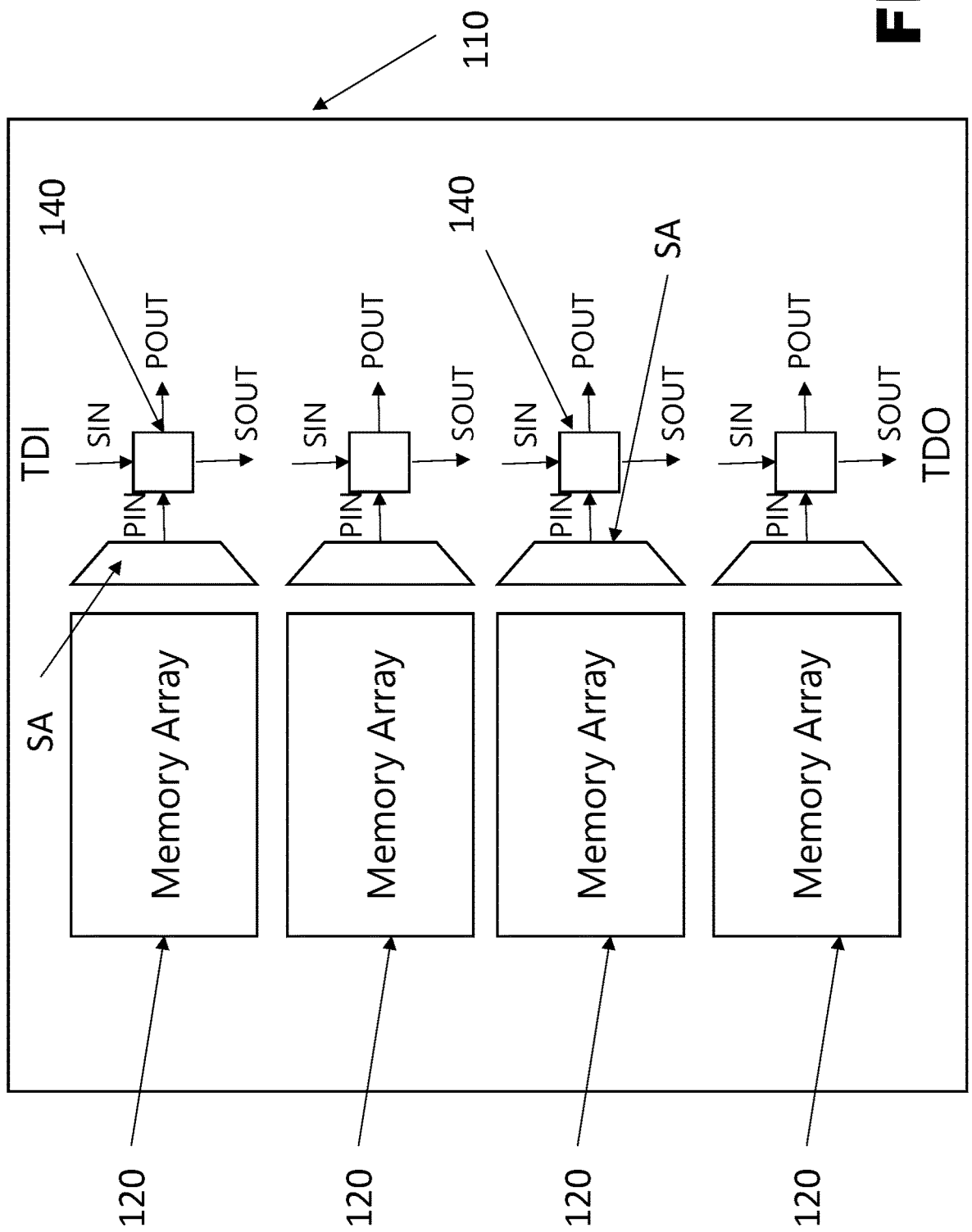
FIG. 3 is a schematic layout view of an example of the memory component according to embodiments of the present disclosure.

Making now more specific reference to the example of FIG. 3, in one embodiment of the present disclosure the memory array 90 is built as a collection of sub arrays 120. In this manner, having smaller sectors if compared to known solutions the access time is significantly reduced and the whole throughput of the memory component is improved.

The advantage of this architecture is that it is very scalable and expanding and/or reducing the density of the final device translated only in mirroring a sub-array and generating the connection.

The host device or the System-on-Chip 10 normally includes more than one core and each core is coupled to a corresponding bus or channel for receiving and transferring data to the memory component 1. Each sub-array 120 has access to a corresponding channel to communicate with a corresponding core of the System-on-Chip.

The core of the host device can have access to a JTAG interface by using some internal pads. Such pads are high speed and have the capability to support the maximum frequency. Such pads however cannot manage analog voltage outside the flash array.

In embodiments of the present disclosure a Direct Memory Access (DMA) allows to reduce the final latency that the SoC can experience when reading the data.

To overcome the problems of flash memory devices embedded in System-on-Chips and obtaining a very low initial latency and high throughput, it has been designed a scalable, low-cost, effective and reliable memory apparatus and method involving completion of read operation with data, address and ECC by DMA flash array, ensuring that the data must be read from exactly the same memory location as the controller is asking for.

Coming now to a closer look to the internal structure of the memory component 100 it should be noted that the architecture of the array 90 is built as a collection of sub arrays 120, as shown schematically in FIG. 3.

Figure 4:
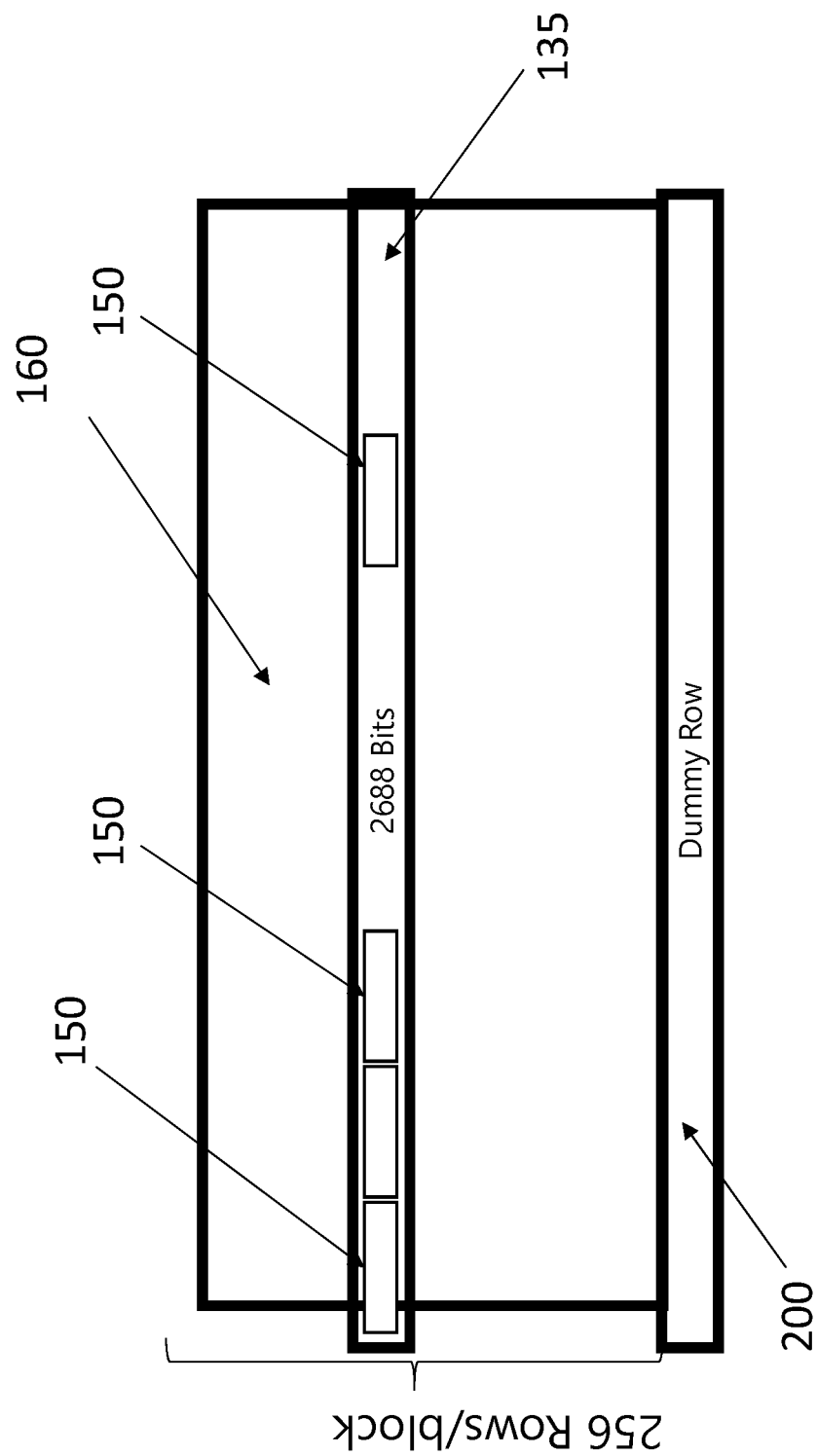
FIG. 4 is a schematic view of a memory block formed by a plurality of rows of the memory array according to one embodiment of the present disclosure.

Each sub array 120 is independently addressable inside the memory device 100. Each sub-array 120 contains multiple memory blocks 160, as depicted in FIGS. 3 and 4.

In this manner, having smaller sectors if compared to known solutions the access time is significantly reduced and the whole throughput of the memory component is improved. The reduction of the initial latency time is at block level because the row and column lines, the read path associated latency and the external communication have been optimized.

In the embodiments disclosed herewith the memory array 90 is structured with a number of sub-arrays 120 at least corresponding to the number of cores of the associated SoC 10 and, therefore to the number of corresponding communication channels. For instance, at least four memory sub arrays 120 one for each communication channel with a corresponding core of the SoC 10 are provided.

The host device or the System-on-Chip 10 normally includes more than one core and each core is coupled to a corresponding bus or channel for receiving and transferring data to the memory component 100.

Therefore, in the present implementation each sub-array 120 has access to a corresponding channel to communicate with a corresponding core of the System-on-Chip 10. The outcome of the memory blocks is driven directly to the SoC without using high power output buffers and optimizing the path.

The advantage of this architecture is that it is very scalable, wherein expanding and/or reducing the density of the final device translates only in mirroring a sub-array and generating the connection or increasing the number of blocks of each subarray, that is the available density per core.

Moreover, in one embodiment of the present disclosure each memory sub array 120 is structured in memory blocks 160 shown schematically in FIG. 4.

Each independently addressable location of the blocks of each memory sub array 90 addresses an extended page 150 that will be also defined hereinafter with the term super page intending a double extended page.

Said differently, the atomic page of 128 bits used in each sub-array 120 to fill the communication channel with the SoC device has been enlarged in the present implementation to contain the stored address and the ECC.

As non-limiting example, this extended page 150 comprises a string including a first group of at least N Bits, for instance one-hundred-twenty-eight (128) Bit for the I/O data exchange with the SoC device 10 plus at least a second group of M Bits, for instance twenty-four (24) address Bit and a final or third group of at least R Bits, for instance sixteen (16) ECC Bit. The M address Bit (in the example the twenty-four address Bits) are sufficient to address up to 2 GigaBit of available memory space.

According to the present disclosure, the outputs of the sense amplifiers SA prepare a double extended page at a time, i.e. a super-page 150 comprising a number of Bits given by the double combination of the above-mentioned three groups of data bits, address bits and ECC bits, according to the size of the memory array.

In the specific but non-limiting example disclosed herewith each extended page 150 includes at least 168 Bit obtained by the combination of the above three groups of N+M+R=128+24+16 data, address and ECC Bit and each super-page is formed by a couple of extended pages, i.e. a group of 168×2 Bits.

Just to give a non-limiting numeric example, each row of a memory block 160 includes sixteen extended pages. Therefore, the resulting row includes 2688 Bit coming out from the combination of sixteen extended pages independently addressable and each including 168 Bit or, said differently, the combination of eight super-pages.

Each memory block contains at least 256 rows and each row includes sixteen super pages of the above size. Each super page includes at least 168 Bits as a combination of data, addressing and ECC Bits. Therefore, each row of the memory array can contain up to sixteen double words of 32 bits each, plus the address and ECC syndrome spare bits per page.

Just to give a numeric value, a super page is formed by 128+16+24=168 Bits and sixteen super pages per each row comprise 168*16=2688 bits.

Therefore, each row 135 of a memory block 160 includes at least sixteen pages comprising a memory word plus the corresponding address Bits and the corresponding ECC Bits.

Obviously, another size can be selected and the reported value are just for illustration purpose of a non-limiting example. The outcome of the blocks is driven directly by the host device or SoC 10 without using high power output buffers of the known solutions and optimizing the path thanks a modified and optimized JTAG interface.

The outputs of the sense amplifiers SA per sub array 120 are latched by an internal circuit of a read interface. The memory structure can be expanded to allow multi-page read while shifting out the already read page.

The sense amplifiers SA are connected directly to a modified JTAG cells, that will be later disclosed, so to integrate a JTAG structure and the sense amplifiers in a single circuit portion. This allows reducing as much as possible the delay in propagating the output of the memory array to the SoC.

As previously said, the internal sense amplifiers 9 are preparing two pages of at least 128 bits plus address and ECC Bits for a total of 168 Bits and while the first page is ready to be shifted, internally it is performed a further read operation of a second page associated with the same address.

This allows to prepare from five to eight double word, that are typical in the RTOS application allowing the sense amplifiers to execute a further internal read operation to prepare the second nibble or group of 168 Bits, if the system is structured with two pages of 168 Bits. This is the reason for having chosen a double page of 2×128 bits plus corresponding addresses and ECC Bits.

This second part of four double words is transferred to the output of the flash array 90, using an additional enabling signal (i.e. an internal clock signal or an ADV signal) that transfers the content read at sense amplifier level to the host device or SoC device 10. The signal names are load_data [0, 1] . . . there is no need of incrementing the address when using the super page.

The combined string of data cells+address cells+ECC cells allows to implement the whole safety coverage of the communication channel according to the standard requirements of the rule ISO26262, because the host first corrects the data stream, if any, and then compares the sent address with the received one.

Moreover, the ECC covers the whole bus communication (data cells+address cells), while the presence of the address cells provides the confidence that the data is coming exactly from the addressed location of the controller, i.e. if ADD==ADD0.

A JTAG interface is adopted for the test of the memory component allowing the re-use of the testing tooling. The memory component of the present disclosure also comprises a JTAG logic including a JTAG interface.

Figure 5:
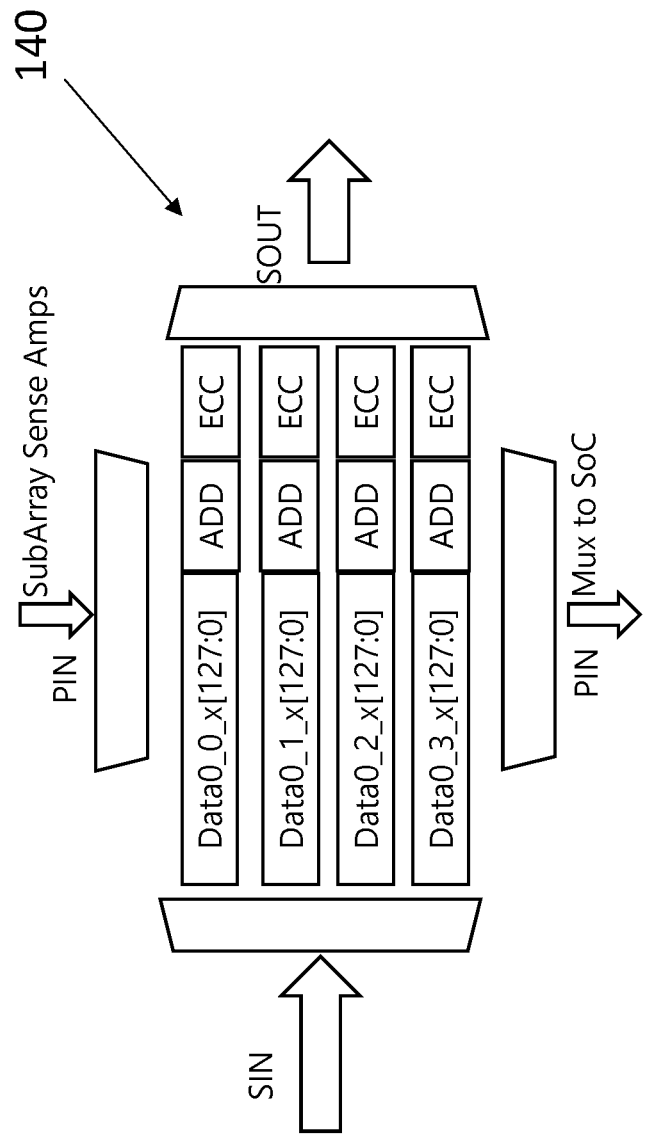
FIG. 5 is a schematic view of a group of address registers for a memory page in the memory component of the present disclosure.

In more details, each memory array includes at least a JTAG interface receiving as inputs standard JTAG signals: TMS, TCK, TDI as well as data from a memory page, for instance the page schematically shown in FIG. 5. According to embodiments of the present disclosure, a flexible TDI signal is used. The flexibility is due to the fact that the number of parallel bits working as TDI are depending from a selected registers, i.e. the instruction register, the address register or the data register, etc.

This JTAG interface produce as output data, addresses and control signals that are transferred to a memory address decoder and also to the internal flash controller to perform modify, testing, verification operations.

The activity of the decoder is allowed by the mentioned charge pumps structured to keep secret the voltages and timings to manage the array. The decoding phase drives the data lines while the charge pumps provide the high voltage routed by the address decoder in the selected data lines.

This decoder addresses the selected memory block. The address decoder is connected to the array to select the proper data lines, i.e. row and column for each super page. the read, modify and any other operations are using the address decoder to properly address bytes in the memory array.

The memory blocks are connected to the sense amplifiers and the sense amplifiers of the read interface are connected to modified JTAG cells (not shown in the drawings) to integrate a JTAG structure and the sense amplifiers in a single circuit portion. This allows reducing as much as possible the delay in propagating the output of the memory array to the SoC.

Each sub-array 120 contains multiple memory blocks. The sub arrays 120 serve each core of the host device and uses optimized block form factor circuitry to address the low latency.

In this manner, having smaller sectors if compared to known solutions the access time is significantly reduced and the whole throughput of the memory component is improved.

Each sub array 1120 is independently addressable inside the memory device 100. Moreover, the memory array 90 is structured with at least four memory sub arrays 120 one for each communication channel with a corresponding core of the host device or SoC 10. The host device or the System-on-Chip 10 normally includes more than one core and each core is coupled to a corresponding bus or channel for receiving and transferring data to the memory component 100.

Therefore, in the present implementation each sub-array 120 has access to a corresponding channel to communicate with a corresponding core of the System-on-Chip 10.

It should be further noted that each subarray 120 includes address registers connected to data buffer registers, similarly to an architecture used in a DRAM memory device.

Moreover, according to one embodiment of the present disclosure, as shown in FIG. 4, at least a dummy row 200 is associated to each block 160 of the memory sub array 120.

This dummy row 200 is located outside the address space of the memory array 90 and is used for the optimization of the read, write and erase parameters. Moreover, this dummy row is used for erase robustness monitor, for good completion of modify operations and others purpose.

According to another embodiment, the dummy row of a block 160 is provided in another block of the memory sub-array 120.

The presence of this dummy row allows storing the read parameters in a proper time and manner to use the monitor operation to optimize the further steps.

Therefore, a main purpose of this dummy row 200 is that of tracking parameters that may be used during the read and erase phases of the memory component 100 and/or to store some parameters for discovering a possible occurred power loss.

The dummy row 200 contains a pattern that is known to the controller 101 of the memory device 100.

Let's suppose to record in the dummy row 200 a known value like 0×55 or 0×AA in hexadecimal form. This value is particularly suitable since it includes the same amount of "0" logic values and "1" logic values that are stored inside the array in distinct flash memory cells, with two different threshold values. However, this does not mean that it is excluded the possibility to use multi-level technology, thus allowing to store more than two bits for each storage transistor or storage element.

Since that value is known a priori also for the memory controller, the system will perform some reading cycles changing the read trimming parameters up to the moment wherein the value will be read correctly. The changed trimming parameter of the correct reading will correspond to a set temperature value recorded in the programmable register. In case of different storing technologies, such as for example the multilevel cell memory (N levels), the values to be stored must be chosen to cover all the N levels present in the memory array.

Only when the trimming parameters set for the reading phase perfectly allow to retrieve the correct known value then the reading phase of the other memory blocks of the sub array 120 may be performed. In this case, the research of the optimized read parameter, corresponds to find out the best sampling point in that operating condition, as it happens when an eye diagram is used.

According to one embodiment of the present disclosure, the temperature and aging drift affecting the memory array 90 may be detected by the memory component 100 itself using a stored reference.

By using the drift information of the well-known pattern stored, it is possible to set the best parameters to be used on the next or any subsequent operation, including the programming phase. In particular, such information can be used for correctly trimming all the voltage values and the timing (i.e. signal shape) to be used in each phase of the read and/or erase algorithm.

In general, the right level of voltage and timing to be used in each erase or programming phase must follow the technological guide line. Such guidelines are normally known for a given technology, since they may be provided by Flash cells technologist as a map between the level of aging and the associate values voltage/timing to be used.

Let's now see the read, programming and/or erase procedures according to this methodology:

The well known parameters are read from the dummy row 200 and elaborated by the internal controller in order to determine the best parameters to be used in the next steps. Then the read and program algorithm can start.

If the parameters are not present in the dummy row 200 then it means that a power loss occurred. This event must be recovered by erasing the whole block. Otherwise the block cannot be correctly programmed or read and the host has to take care of this situation if the operation is not already an erase phase.

During an erase pulse phase, the voltage and pulse duration can be set to fast and safe erase the cells in the block (according to the previous step).

If the block is cycled (many program-erase cycles, estimated by using drift information) some appropriate strong voltages and pulses duration are used. Normally a block is erased by applying several erase pulses at different (negative for the gate voltage and/or positive for the body-source). This sequence is called staircase and is used to apply proper pulse to modify the content of the array. Sometimes, if the block is aged the staircase is bigger or lasts more time.

Once an erase pulse is issued (as above) the erase cells status is verified by applying a proper cell gate voltage value to be used to perform an erase verify, with enough margin, to guarantee a well erased cell distribution. Also, here the drift information can be used to select the right erase verify values.

Figure 6:
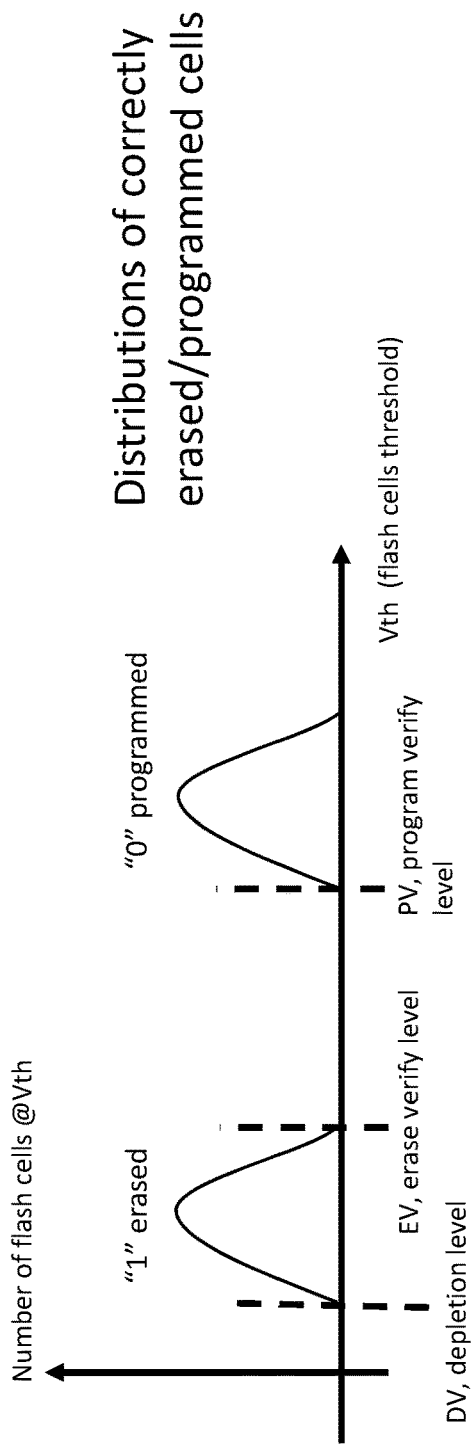
FIG. 6 shows in a schematic diagram the distribution of a well erased/programmed cell (1 bit/cell)

For instance, FIG. 6 shows in a schematic diagram the distribution of a good erased/programmed (1 bit/cell) cell. All the cell threshold population are correctly confined in the boundary assigned (i.e. programmed '0' or erased '1'). The steps #1 and #2 are repeated up to all the cells satisfy the erase verify criteria.

Once all the cells are correctly (erased) verified, it is also checked if there are cells with a too low threshold. In the FIG. 6 this is shown by the label depletion verify, DV.

In case of depletion a soft-program operation is issued on the cells that need it. The parameters to be used to perform a soft-drift of the cells, in order to right place the thresholds inside the erase cell distribution can be chosen according the aging level of the cells.

A wrong selection of such a parameter can cause a bad placement of the cells' threshold outside the erased distribution (over the erase verify value) and this would imply that the block must be erased again starting from the above step #1(this would be a time consuming).

Once the erase is complete (the above phases are done) the well known pattern are written in the row 200 to be used on the next erase cycle. In particular, the pattern that was selected by the storing of the set values (0×55, 0×AA etc.) are programmed and verified (see the PV phase of FIG. 6) accordingly by using an appropriate program pulse which voltage and timing are depending on the current aging level of the block. The content of the dummy row 200 is also erased accordingly; that the flash controller has to restore it after the erase.

By using the drift information and the number of erase pulses provided in the erase phase (bullet 1 above) it is possible to infer that a block is near to its end of life. This information could be used as warning for the customer or as flag for internal algorithm in order to trigger a possible block wear leveling or OFBR (On Field Block Redundancy) operation, if implemented.

Figure 7:
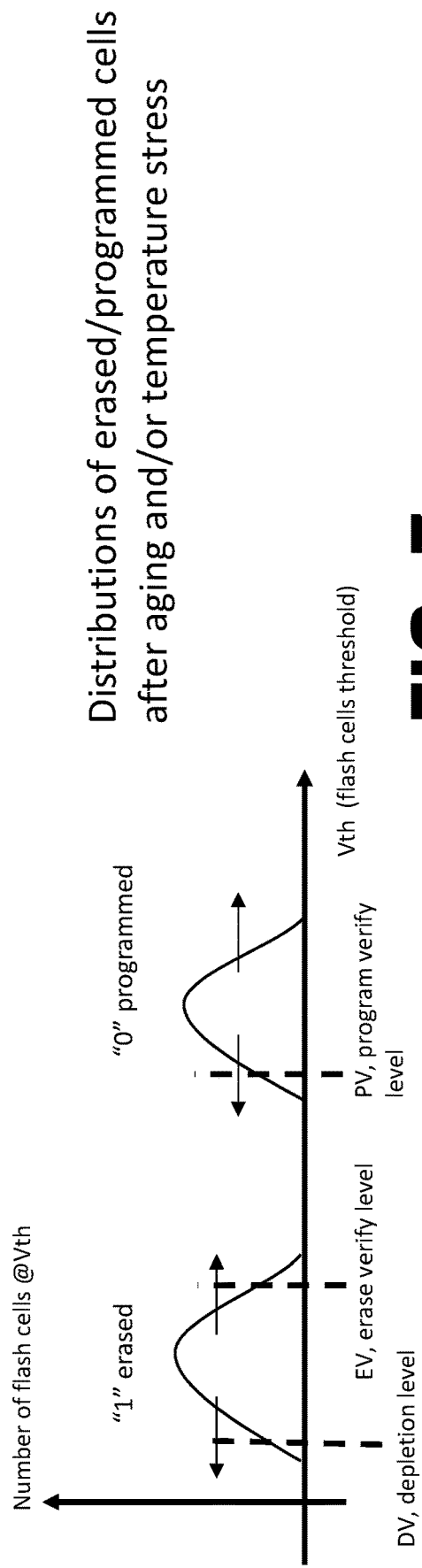
FIG. 7 shows a diagram corresponding to FIG. 6 reporting an enlarged distribution shifted toward the depletion state (negative Vth) due to aging, temperature and stress.

FIG. 7 shows a diagram corresponding to FIG. 6 but reporting an enlarged distribution due to aging, temperature and stress. With the aging, temperature and stress the distributions tend to enlarge and move. According to the methodology of the present disclosure it is possible to use the distribution enlargement to track the cells degradation and use this information to correct the next erase pulses. This permits to improve the reliability and the performances of the erase phase.

The trimming sequence to perform a reading phase of the memory array at different temperatures or different aging of the memory devices may be detected in a lab and stored in a programmable register of the memory controller 101.

Similarly, a regulation of the parameters used during the erasing and programming phase may be performed in the same manner during actual operation.

For the content of a correct reading phase it is not important the real temperature value at which the reading phase is performed. Such a temperature could be higher (even much higher) or lower if compared to the level of temperature at which the programming phase of the known value has been performed.

The system is automatically protected by any thermal drift since the reading trimming parameters are selected after having performed the correct reading of the known sequence stored in the dummy row 200 and having set accordingly the trimming parameter for reading correctly that known value. This feature can be a capability left and driven to the host device since during the read phase there is no time to read in parallel the dummy row. The same applies before the reading phase is started due to the low initial latency that the present embodiments supports.

The procedure allowing to identify the more suitable reading trimming parameters for a correct reading phase at a certain temperature value are not necessarily repeated at any reading phase. On the contrary, such a procedure may be performed periodically or, in a more appropriate manner, when possible problems are detected by the ECC bits.

It happens for instance that an increased number of ECC bits is indicative of an excessive number of wrong reading from the memory device (e.g., when a number of bits corrected by the error correction engine exceeds a threshold number). In such a case, the system may automatically start the procedure for detecting a possible thermal drift or aging and a consequent need to change the trimming parameters.

In one embodiment the above procedure could be triggered by a host command. In some embodiments the procedure may be triggered by a particular event, such as a temperature variation detection, for example.

The dummy row 200 may be configured to store information indicative of a fail of the erase operation.

The method of the present disclosure allows to properly perform the reading phase of the memory component 100, or better of a memory block 160.

Figure 8:
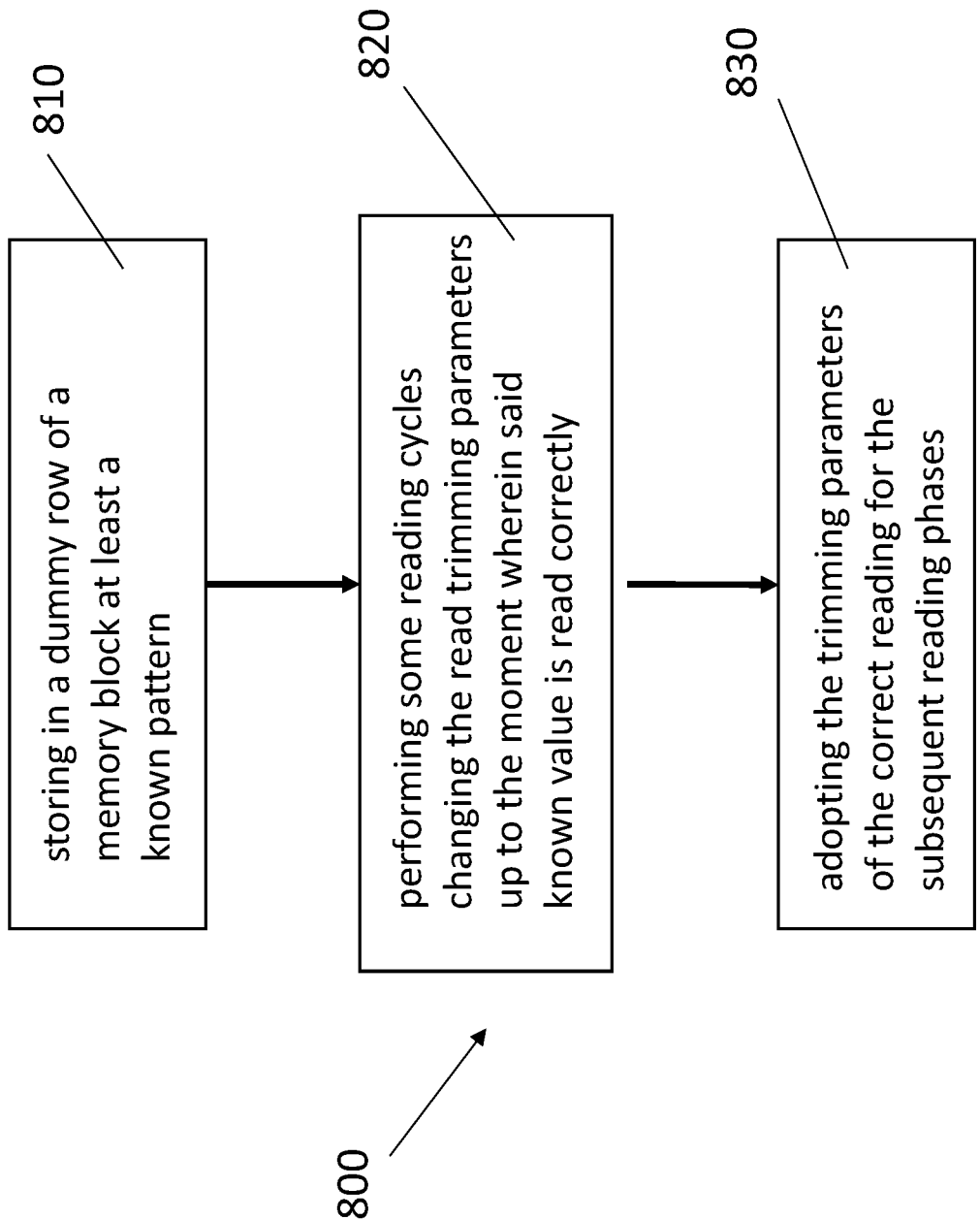
FIG. 8 shows in a block diagram the phases of a method according to the present disclosure.

The method phases are schematically illustrated in the block diagram of FIG. 8.

The method 800 for improving the safety of the reading phase of a non-volatile memory device including at least an array of memory cells and with associated decoding and sensing circuitry and a memory controller, the method comprising:
storing in a dummy row of said memory block at least a known pattern;
performing some reading cycles changing the read trimming parameters up to the moment wherein said known value is read correctly;
adopting the trimming parameters of the correct reading for the subsequent reading phases.

The above steps are shown in the respective squared blocks 810, 820 and 830.

In one embodiment the known pattern has a large number of bit programmed ('0') and erased ('1') in equal number, for instance adopting an hexadecimal configuration of (0×AA, 0×55 etc.).

Moreover, the regulation based on the dummy row content can involve the selection of the bias values of the cells to be read and/or the selection of a proper value to be used as read reference cell.

Only when the trimming parameters set for the reading phase allow retrieving the correct known value then the reading phase of the other memory blocks of the sub array 120 is may be performed.

Each sub array 120 can have its own blocks and he optimum parameters can even be different from one sub array to the other sub array and from block to block.

The changed trimming parameters of the correct reading correspond to a set temperature value recorded in the programmable register.

As a matter of fact, the storage of the critical parameters can provide feedback on the healthiness of the block, determining also the way the wear leveling must be applied to the block 160 of the sub-array 120.

The presence of the known pattern at the end of the dummy row ensures the correctness of the operation.

The method of the present disclosure allows obtaining a dynamic erase verification of the erasing phase since it is possible obtaining a secure feedback of the correctness of the erase operation even in different operating environmental conditions.

The invention claimed is:

1. An apparatus, comprising:
a plurality of memory blocks;
a dummy row corresponding to blocks of the plurality of memory blocks for storing a corresponding known pattern and a read trimming parameter for reading the known pattern outside of an addressable space of a corresponding memory block of the plurality of memory blocks; and
control circuitry configured to:
read the known pattern stored in the dummy row of the corresponding memory block by performing reading phases and changing the read trimming parameter stored in the dummy row up to a moment a value of the known pattern stored in the dummy row is read correctly;
determine, in at least one of the reading phases, that a power loss has occurred; and
erase the memory block responsive to the determination the power loss has occurred.

2. The apparatus of claim 1, wherein the known pattern stored in the dummy row corresponding to the memory block is known to the control circuitry, and wherein the known pattern stored in the dummy row includes an equal number of bits programmed to logical values of one and zero.

3. The apparatus of claim 1, wherein the changed read trimming parameter corresponds to a temperature value recorded in a programmable register.

4. The apparatus of claim 1, wherein the dummy row is configured to store internal block variables.

5. The apparatus of claim 4, wherein the internal block variables include reading pulses or target voltages, or both, applied to the memory block during the reading phases.

6. The apparatus of claim 1, wherein the control circuitry is configured to utilize the read trimming parameter when the known pattern stored in the dummy row corresponds to the memory block being read correctly to select a value of a read reference cell.

7. The apparatus of claim 1, wherein the known pattern stored in the dummy row is known to the control circuitry, and wherein the known pattern stored in the dummy row includes an equal number of bits programmed to programmed values and erased values.

8. An apparatus, comprising:
a memory component comprising a plurality of memory blocks, wherein:
a memory block of the plurality of memory blocks stores data in an addressable space; and
a dummy row corresponding to the memory block of the plurality of memory blocks stores a known pattern and trimming parameters to read the known pattern outside the addressable space of the memory block;
a system-on-chip (SoC) coupled to the memory component, wherein the SoC is configured to perform error correction operations on data retrieved from the addressable space of the memory block; and
a controller configured to:
determine a number of corrected bits based on the data retrieved from the addressable space of the memory component by the SoC exceeding a threshold associated with the known pattern stored in the dummy row;
determine, based on a determined absence of the trimming parameters in the dummy row, that a power loss has occurred; and
erase the entire memory block responsive to the determination the power loss has occurred.

9. The apparatus of claim 8, wherein the dummy row is configured to store internal block variables of the reading phase or an erasing phase, or both.

10. The apparatus of claim 8, wherein the internal block variables include pulses or target voltages, or both, applied to the memory block.

11. The apparatus of claim 8, wherein:
the memory component comprises an array of memory cells,
the array of memory cells includes a plurality of independently addressable memory blocks, and
each of the plurality of independently addressable memory blocks block includes at least 256 rows of memory cells and each row includes at least sixteen super pages each formed by a combination of data bits, address bits, and error correction code bits.

12. The apparatus of claim 8, wherein the memory component physically overlaps a portion of the SoC.

13. The apparatus of claim 8, wherein the memory component comprises a plurality of pads arranged in a configuration that, when the component is reversed, the plurality of pads are couplable to corresponding pads of the SoC.

14. A method, comprising:
storing a known pattern in a dummy row corresponding to a memory block of a plurality of memory blocks, wherein:
the memory block stores data in an addressable location of the memory block and the dummy row stores the known pattern outside an addressable space of the memory block;
determining, based on a determined absence of a parameter in the dummy row utilizable to read the known pattern, that a power loss has occurred; and
erasing the entire memory block responsive to the determination the power loss has occurred.

15. The method of claim 14, wherein the known parameter corresponds to a temperature value recorded in a programmable register associated with the plurality of memory blocks.

16. The method of claim 14, wherein the known pattern includes values in hexadecimal form.

17. The method of claim 14, wherein the known pattern comprises a same amount of "0" logic values and "1" logic values.

18. The method of claim 14, wherein the dummy row is configured to store information indicative of a failure involving an erase operation.

19. The method of claim 14, further comprising initiating an erasing phase on the memory block based on retrieving internal block variables of a previous erasing phase from the dummy row.

20. The method of claim 14, wherein the reading phase is performed automatically when an increased number of error correction code bits involving the memory block is detected.

* * * * *